United States Patent [19]

Sato et al.

[11] Patent Number: 4,712,160
[45] Date of Patent: Dec. 8, 1987

[54] POWER SUPPLY MODULE

[75] Inventors: Toshiaki Sato, Hirakata; Hisako Mori; Yashuhiko Horio, both of Osaka; Kastumi Tabuchi, Hirakata; Nobuo Matsumoto, Hirakata; Kazuhiko Nishii, Hirakata, all of Japan

[73] Assignee: Matsushita Electric Industrial Co., Ltd., Osaka, Japan

[21] Appl. No.: 880,315

[22] Filed: Jun. 30, 1986

[30] Foreign Application Priority Data

Jul. 2, 1985 [JP] Japan .................................. 60-145559
Jul. 9, 1985 [JP] Japan .................................. 60-150738

[51] Int. Cl.$^4$ .............................................. H05K 7/20
[52] U.S. Cl. ...................................... 361/388; 361/395; 363/141; 174/52 PE
[58] Field of Search ................ 363/141, 146; 307/150; 174/16 HS, 52 PE; 361/383, 386–389, 392–395, 399

[56] References Cited

U.S. PATENT DOCUMENTS

| | | | |
|---|---|---|---|
| 3,359,461 | 12/1967 | Schuler et al. | 361/392 |
| 3,582,714 | 6/1971 | Shmurak | 361/389 |
| 3,699,394 | 10/1972 | Schuler | 361/389 |
| 3,934,177 | 1/1976 | Horbach | 361/388 |
| 4,218,724 | 8/1980 | Kaufman | 361/395 |

Primary Examiner—G. P. Tolin
Attorney, Agent, or Firm—Wenderoth, Lind & Ponack

[57] ABSTRACT

Disclosed herein is a power module which is simple in assembly and which allows efficient release of heat generated by a converter transformer and power devices on primary and secondary circuits which are electrically separated from each other. The power module is of a construction such that a converter transformer, a primary circuit board on one side of which a part of the primary circuit of a switching power supply unit is integrated, and a secondary circuit board on one side of which a part of the secondary circuit of the switching power supply unit is integrated are three-dimensionally joined into an integral module by a resin of high thermal conduction and electrical insulation properties, the device-mounted sides of the primary and secondary circuit boards facing each other. The transformer may be placed between the two circuit boards or, alternatively, in parallel and adjacent to the two circuit boards.

8 Claims, 35 Drawing Figures

POWER SUPPLY MODULE

BACKGROUND OF THE INVENTION

1. Field of the Invention

The present invention relates to a modular construction of a power circuit and converter transformer of a switching power supply unit.

2. Description of the Prior Art

In recent years, the development of smaller and lighter low power systems has been progressing remarkably to meet the demand for smaller electronic equipment. As for high power systems, however, particularly power circuits, reduction in size and weight has not yet been realized.

In fact, the mounting technology developed for low power systems is virtually useless for high power systems, due to heat radiation from high power devices and the constructional requirement that high power devices be placed close to one another. Accordingly, in view of the electrical separation between primary and secondary circuits and the heat radiation requirement, a large heat sink is mounted on each semiconductor device of a power system, as a method employed at present.

The integrated module disclosed in Japanese Laid-Open Patent Application No. 44-21621 (U.S. Pat. No. 3,359,461) has provided a solution to the conventional problems. This module comprises power devices and a converter transformer housed in a hollow prism container surrounded by electroconductive side walls. However, the module has the following problems:

(1) It involves many assembly processes because of its complicated structure.

(2) Since the entire module is electroconductive, insulation from surrounding structures is difficult.

(3) The converter transformer in the module is susceptible to heat radiation from surrounding power devices.

(4) Since the power devices are mounted on the side walls, electrical separation between the primary and secondary circuits, essential in power equipment, is difficult.

In short, defective spatial layout of primary and secondary circuits and converter transformers has resulted in the above problems.

SUMMARY OF THE INVENTION

It is an object of the present invention to provide a power module which ensures electrical separation between the primary and secondary circuits as well as thermal insulation of the converter transformer from the primary and secondary circuits, and which effectively releases heat.

To achieve the above object, according to the present invention, a primary circuit board, on one side of which a part of the primary circuit of a switching power supply unit is integrated, and/or a secondary circuit board, on one side of which a part of the secondary circuit of the switching power supply unit is integrated, and a converter transformer are three-dimensionally joined into an integral module using a resin of good thermal conductance and electrical insulation.

In the above module of the present invention, the primary and secondary circuit boards are arranged so that the device-mounted sides face each other, with the converter transformer placed between them. Alternatively, the primary and secondary circuit boards may be arranged with the device-mounted sides facing each other and the converter transformer placed in parallel and adjacent to the primary and secondary circuit boards.

Owing to the above construction, it is possible to effectively release heat generated by the power devices on the primary and secondary circuit boards and by the converter transformer, the primary and secondary circuits being electrically separated from each other.

Accordingly, it is possible to realize a small power module which is also simple in assembly.

It is preferable to use metal substrates (such as aluminum) for the primary and secondary circuit boards to achieve better heat radiation.

Figure 1A:
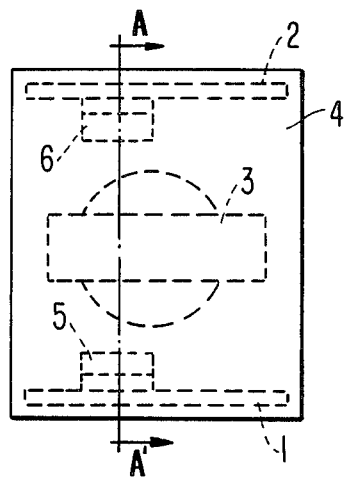
FIGS. 1(A), 1(B), 3(A), 3(B), 5(A), 5(B), 7(A), 7(B), 7(C), 8(A), 8(B), 8(C), 10(A), 10(B), 10(C), 12(A), 12(B), 12(C), 13(A), and 13(B) are top and sectional views of embodiments of a power module of the present invention.

Throughout the specification, the following reference numerals will be used in common.

1 . . . Primary circuit board
2 . . . Secondary circuit board
3 . . . Converter transformer
4 . . . Electrical insulation material
5 . . . Power device on the primary side
6 . . . Power device on the secondary side
7a . . . Lead terminal of the circuit board
7b . . . Lead terminal of the converter transformer
8 . . . Heat sink
9, 10a and 10b . . . Clearance
11 . . . Primary or secondary circuit board
12 . . . Power device on the primary or secondary circuit board
13 . . . DC power source
14 . . . Control circuit
15 . . . Switching transistor
16 and 18 . . . Snubber circuit
19 . . . Rectifier diode
20 . . . Smoothing capacitor
21 . . . Load

DESCRIPTION OF THE PREFERRED EMBODIMENTS

Some embodiments of a power module of the present invention will be described below, with reference to the accompanying drawings.

Figure 1B:
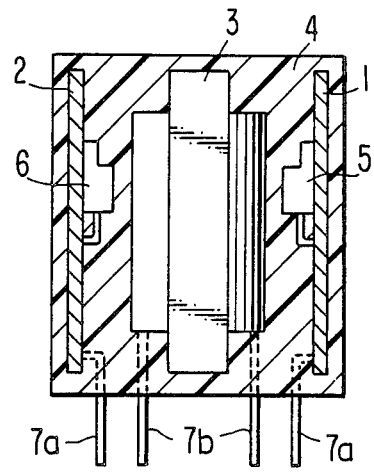

FIGS. 1(A) and 1(B) show top and sectional views of a power module, a first embodiment of the invention.

Figure 2:
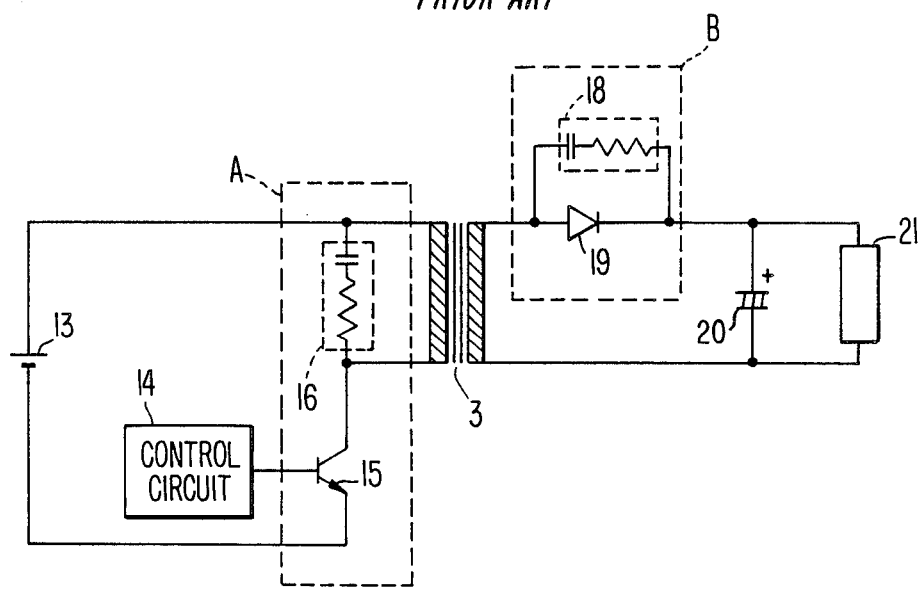
FIG. 2 is a conventional circuit diagram, for reference, of a switching power supply suitable to the power module of the present invention.

First, a power circuit to which the power module of the present invention is applicable is briefly described with reference to FIG. 2, which shows the well-known circuit of a DC to DC flyback converter. Referring to FIG. 2, the DC to DC flyback converter circuit is composed of a DC power source (13), a power load (21), a switching transistor (15), a control circuit (14) for controlling ON/OFF operation of the switching transistor (15) to stabilize the voltage output of the power load (21), snubber circuits (16) and (18) added to the switching transistor (15) and a rectifier diode (19), respectively, a converter transformer (3) and a smoothing capacitor (20). The operation of the flyback converter is not described here since it is so well known.

In FIG. 2, components which generate heat on the primary circuit are enclosed by dashed line A (group A); those generating heat on the secondary circuit are enclosed by dashed line B (group B). For noise prevention, the wire length between the transformer (3) and component groups A and B should be as short as possible. In addition, it is necessary to electrically separate the circuit of group A from that of group B to ensure insulation.

Referring to FIGS. 1(A) and 1(B): (1) is a primary circuit board on which the components of group A of FIG. 2 are integrated on one side; (2) is a secondary circuit board on which the components of group B of FIG. 2 are integrated on one side; (3) is a converter transformer; (4) is an electrical insulation material for joining the entire module. The insulator may be polyester resin, epoxy resin or other resin which provides high electrical insulation and heat radiation. (Hereinafter, the electrical insulation material is referred to as "resin".) Numerals (5) and (6) are devices in component groups A and B, respectively; (7a) is a terminal of circuit board (1) or (2); and (7b) is a terminal of the transformer (3). In this embodiment, circuit boards (1) and (2) are arranged so that the sides on which devices (5) and (6) are mounted, respectively, face each other, and transformer (3) is placed between circuit boards (1) and (2). Circuit boards (1) and (2) and the transformer (3), thus arranged, are entirely and three-dimensionally joined by the resin (4) into an integral module.

With the above construction, heat generated by circuit boards (1) and (2) and by the transformer (3) is released throughout the resin, so that it is not necessary to provide special radiation measures for each power device. In addition, it is possible to connect the transformer (3) with the circuit boards (1) and (2) by short wire; and since component groups A and B are mounted on separate substrates, the two circuits can be electrically separated.

Thus the power circuit, whose assembly is conventionally discrete, can be assembled into a compact module with the primary and secondary circuits electrically separated.

Figure 3A:
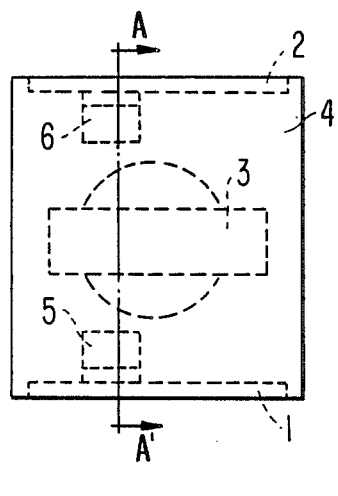
Figure 3B:
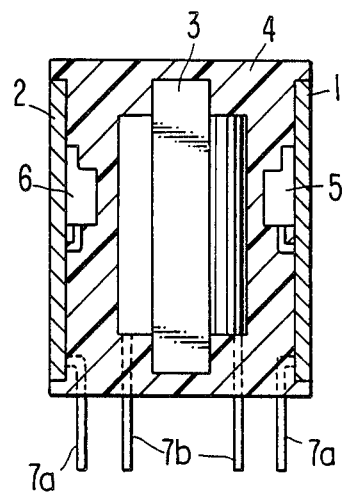

FIGS. 3(A) and 3(B) show a second embodiment of the present invention in which radiation from circuit boards (1) and (2) is further improved over the first embodiment.

FIGS. 3(A) and 3(B) are a top view and a sectional view, respectively, of the second embodiment of the power module of the present invention. Components identical to those in the first embodiment are identified by the same numerals.

In the second embodiment, circuit boards (1) and (2) and the converter transformer (3) are entirely and three-dimensionally combined by the resin (4) into an integral module in such a manner that the sides with no devices, i.e., the heat radiating sides of circuit boards (1) and (2), define outer walls of the module.

The second embodiment with the above construction provides the same effects as the first. If metal substrates with good heat radiation properties (such as aluminum substrates) are used for circuit boards (1) and (2), efficiency of heat release through the radiating sides is further improved.

Figure 4:
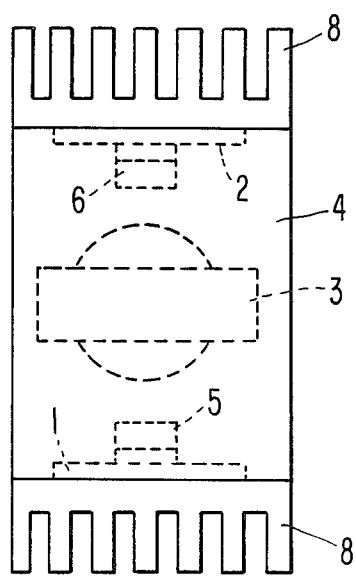
FIGS. 4, 6, 9 and 11 are top views of embodiments of a power module of the present invention.

Heat sinks (8) mounted on the radiating sides of circuit boards (1) and (2), respectively, as shown in FIG. 4, can increase the heat radiation performance of the power module of the second embodiment.

Now, a third embodiment, superior in thermal insulation to the second embodiment, will be described.

Figure 5A:
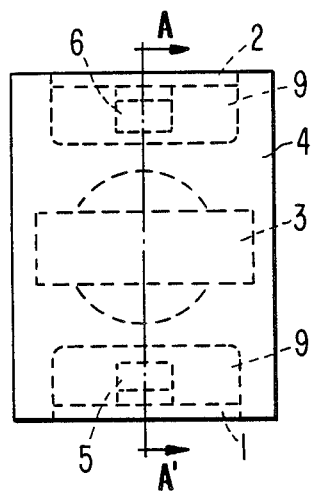
Figure 5B:
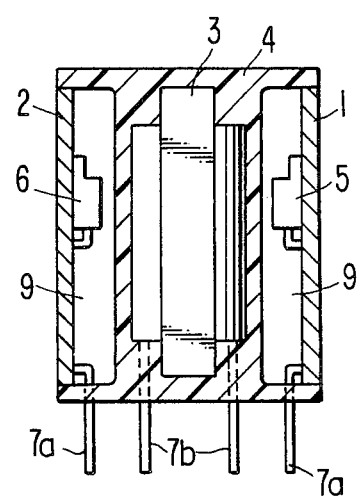

FIGS. 5(A) and 5(B) are a top view and a sectional view, respectively, of the third embodiment of the power module of the present invention. In these figures, the components identical to those in the second embodiment are designated by the same numerals.

The layout of circuit boards (1) and (2) and the converter transformer (3) of the third embodiment is the same as that of the second embodiment, except that clearances or empty spaces are provided between the resin (4) and the device-mounted sides of circuit boards (1) and (2), for thermal insulation.

The clearances (9) between the resin (4) and circuit boards (1) and (2) serve to reduce thermal transmission from circuit boards (1) and (2) to the transformer (3), i.e., prevent heat generated by the devices on circuit boards (1) and (2) from being transmitted to the transformer (3). Simultaneously, the thermal conduction between the two circuit boards is also reduced by the clearances (9). With such thermal insulation, the heat of the entire module can be released outside the module without accumulating inside.

Figure 6:
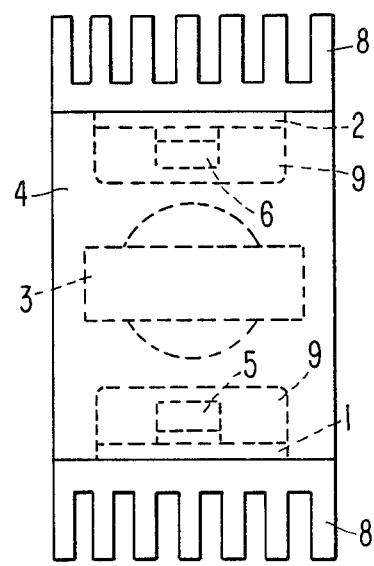

Heat sinks (8) mounted on circuit boards (1) and (2), as shown in FIG. 6, can further increase the thermal radiation from circuit boards (1) and (2).

The clearances (9) may be provided between the resin (4) and either of circuit boards (1) and (2) or between the transformer (3) and circuit boards (1) and (2).

The clearances (9) may be filled with air or resin of good insulation property and low thermal conductance. A fourth embodiment, described below, realizes more effective thermal insulation of the transformer (3) from circuit boards (1) and (2).

Figure 7A:
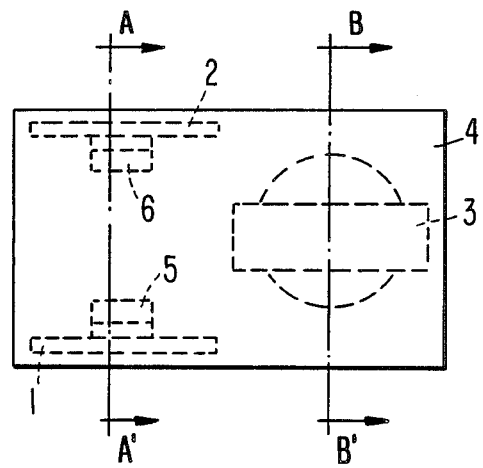
Figure 7B:
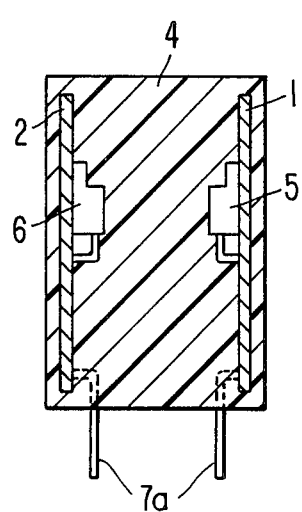
Figure 7C:
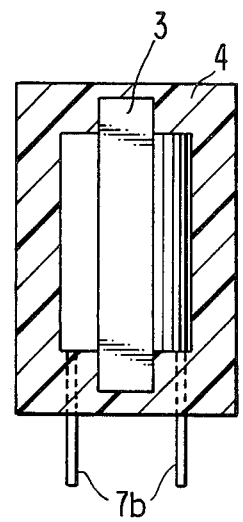
Figure 18A:
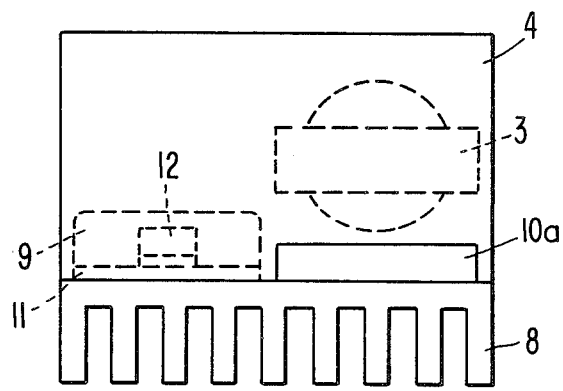
FIGS. 14(A), 14(B), 15(A), 15(B), 16(A), 16(B), 17(A), 17(B), 18(A) and 18(B) are other possible module constructions, modifications of the embodiments of the present invention.
Figure 18B:
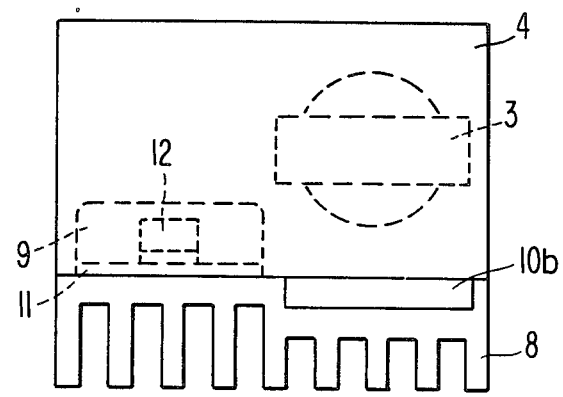

FIGS. 7(A), 7(B) and 7(C) are top and sectional views, respectively, of the fourth embodiment of the power module of the present invention. In the figures, the components identical to those in the first embodiment are designated by the same numerals.

In this embodiment, circuit boards (1) and (2) are arranged with the device-mounted sides facing each other, and the converter transformer (3) placed in parallel and adjacent to one end of the circuit boards (1) and (2) such that the converter transformer is not between the circuit boards. Circuit boards (1) and (2) and the transformer (3) thus arranged are entirely and three-dimensionally joined by the resin (4) into an integral module.

The fourth embodiment with the above construction provides the same effects as the first embodiment. Compared to the first embodiment, the fourth is superior, in thermal insulation because of the parallel out offset arrangement of the transformer (3) to circuit boards (1) and (2). Accordingly, heat from the transformer (3) is more easily released from the resin (4) in the fourth embodiment than in the first embodiment.

A fifth embodiment, which is more advantageous vis-a-vis heat radiation from circuit boards (1) and (2) than the fourth embodiment, will now be described.

Figure 8A:
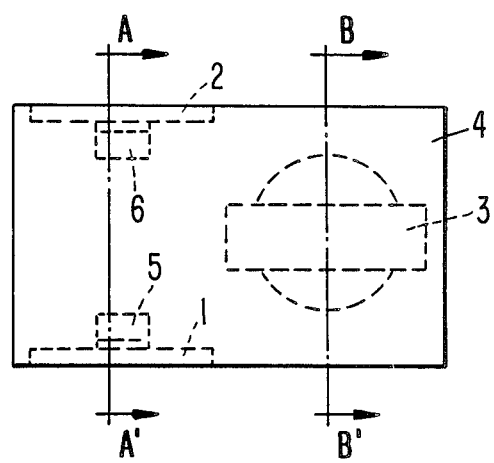
Figure 8B:
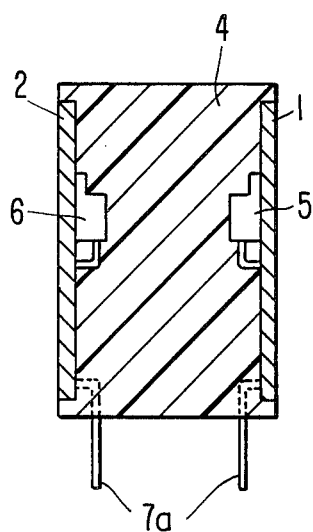
Figure 8C:
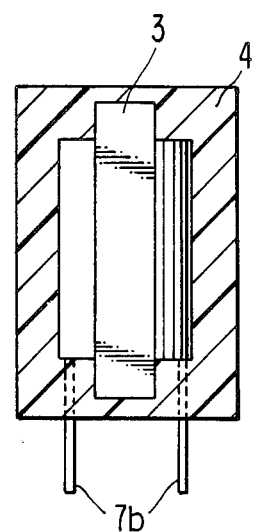

FIGS. 8(A), 8(B) and 8(C) are top and sectional views, respectively, of the fifth embodiment of the power module of the present invention. In the figures, the components identical to those in the fourth embodiment are designated by the same numerals.

In this embodiment as well, circuit boards (1) and (2) and the converter transformer (3) are entirely and three-dimensionally joined by the resin (4) into an integral module having the same layout as the fourth embodiment, excepting that the radiating sides of the circuit boards with no device thereon define the outer walls of the module.

Figure 9:
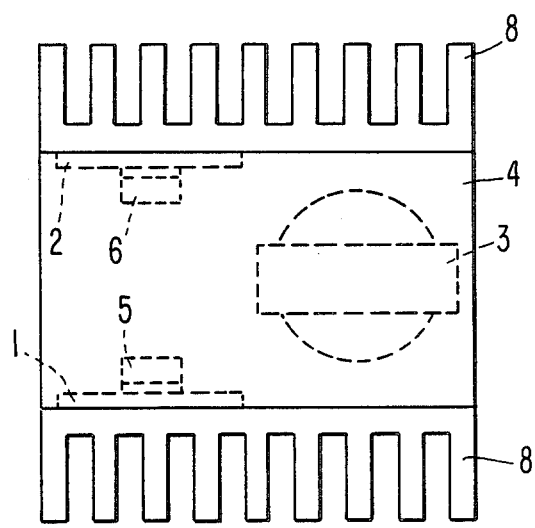

The fifth embodiment, with the above construction, adds the advantage of the fourth embodiment to that of the second. Heat sinks (8) mounted on circuit boards (1) and (2) of the fifth embodiment, as shown in FIG. 9, further improve the efficiency in heat radiation.

A sixth embodiment, which is superior in thermal insulation to the fifth embodiment of the present invention, will now be described.

Figure 10A:
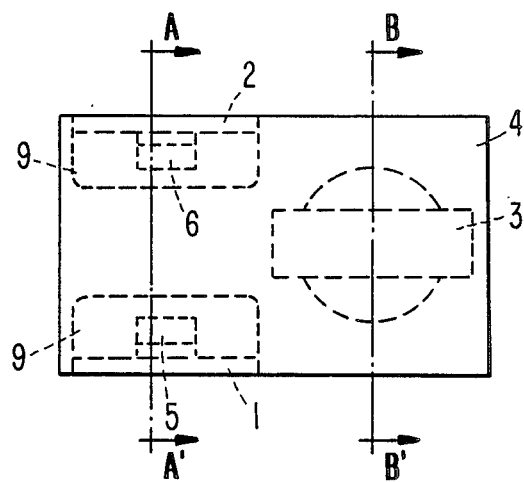
Figure 10B:
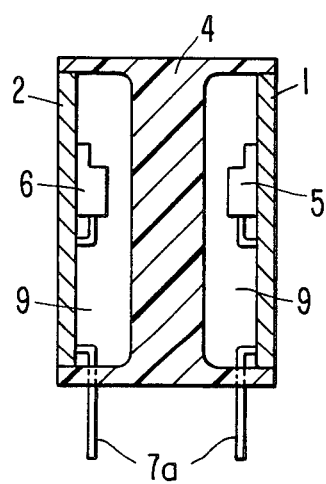
Figure 10C:
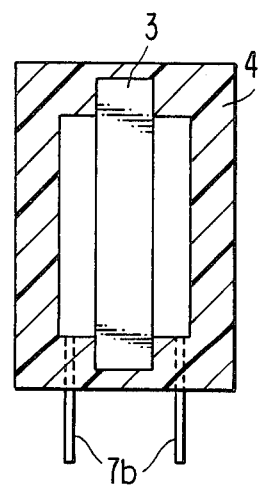

FIGS. 10(A), 10(B) and 10(C) are top and sectional views, respectively, of the sixth embodiment of the power module of the present invention. In the figures, the components identical to those in the fifth embodiment are designated by the same numerals.

The layout of circuit boards (1) and (2) and the converter (3) in the sixth embodiment is the same as that in the fifth embodiment, except that clearances (9) are provided between the resin (4) and circuit boards (1) and (2), for thermal insulation.

Figure 11:
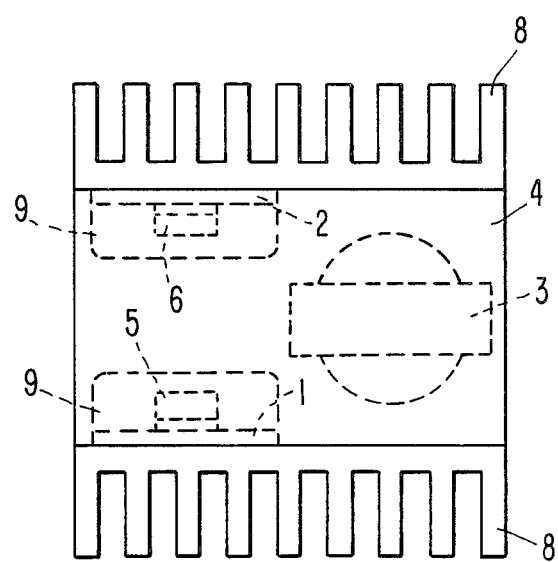

The sixth embodiment, with the above construction, adds the advantage of the fifth embodiment to that of the third. Heat sinks (8) mounted on circuit boards (1) and (2) of the sixth embodiment, as shown in FIG. 11, further improve the efficiency in heat radiation from circuit boards (1) and (2).

As in the third embodiment, the clearance (9) can be provided between the resin (4) and either of the circuit boards (1) and (2) or between the converter transformer (3) and circuit boards (1) and (2) without losing the effect mentioned above.

Furthermore, the same effect can be also expected if the clearance (9) is filled with resin of high insulation and low conductance, in place of air.

The most preferable embodiment will be described below, in which the thermal insulation of heat sinks and the converter transformer from the resin is improved beyond that of the sixth embodiment.

Figure 12A:
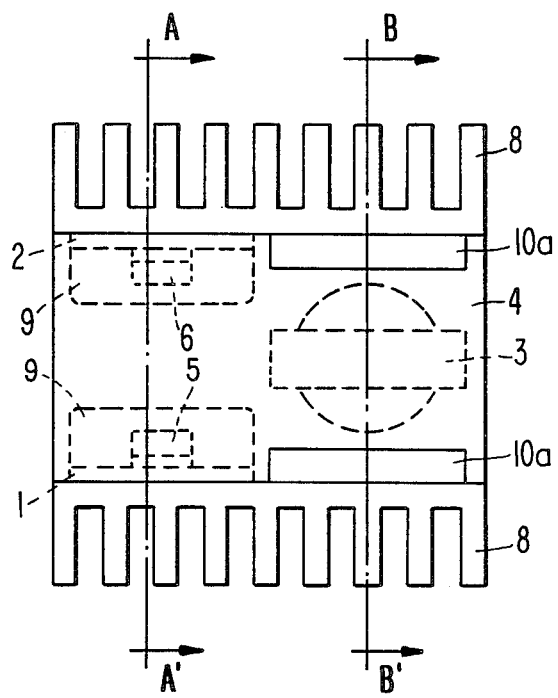
Figure 12B:
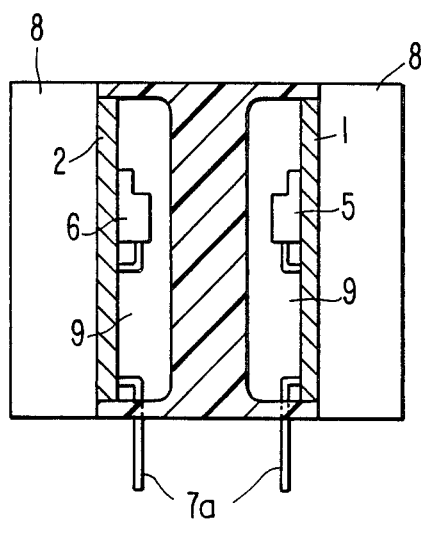
Figure 12C:
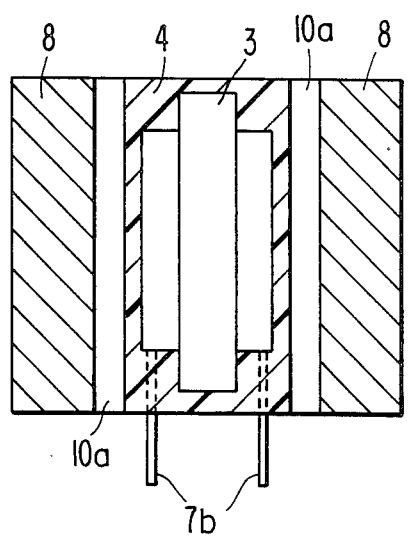

FIGS. 12(A), 12(B) and 12(C) are top sectional views, respectively, of a seventh embodiment of the power module of the present invention. The components identical to those in the sixth embodiment are designated by the same numerals.

In this embodiment, the layout of circuit boards (1) and (2) and the converter transformer (3) is the same as the sixth embodiment, except that clearances (10a) are provided between the converter transformer (3) and the heat sinks (8) for the same reason as clearances (9) are provided between circuit boards (1) and (2) and the resin (4) in the fifth embodiment.

The clearances (10a) serve to reduce thermal transmission from circuit boards (1) and (2) to the converter transformer (3) by hindering transmission of heat from the devices on circuit boards (1) and (2) via the heat sinks (8) to the transformer (3). This thermal separation between the heat sinks (8) and the resin (4) allows the heat of the entire module to be released outside the module, without accumulating inside.

Figure 13A:
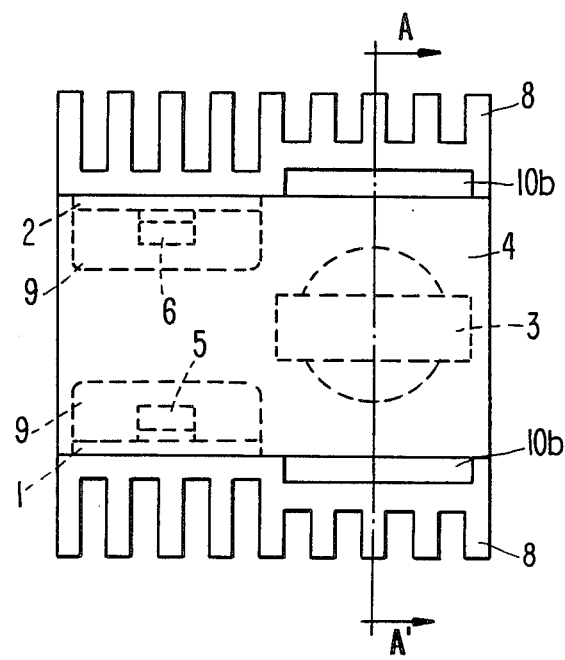
Figure 13B:
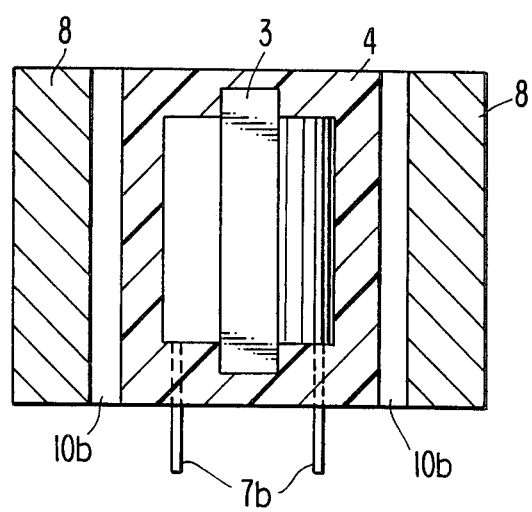

As a modified embodiment of the seventh embodiment, instead of providing the clearances (10a) between the heat sinks (8) and the converter transformer (3), clearances (10b) may be formed in the heat sinks (8) by machining them as shown in FIG. 13. This modification yields the same effect as in the seventh embodiment.

All of the above-mentioned, embodiments of the present invention involve both the primary and secondary circuit boards. The same effects as achieved in these embodiments are realized if the module contains either of the primary and secondary circuit boards, as shown in the following embodiments.

Embodiments of the present invention which contain either the primary or secondary circuit board will now be described with reference to FIGS. 14 through 18.

In these figures, (11) is a primary or secondary circuit board and (12) is a device mounted on the circuit board (11).

Figure 14A:
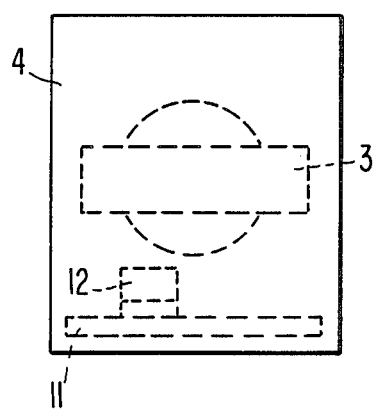
Figure 14B:
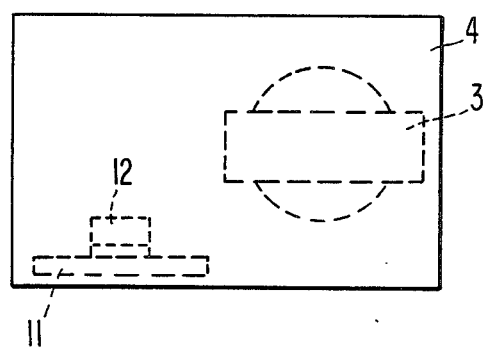
Figure 15A:
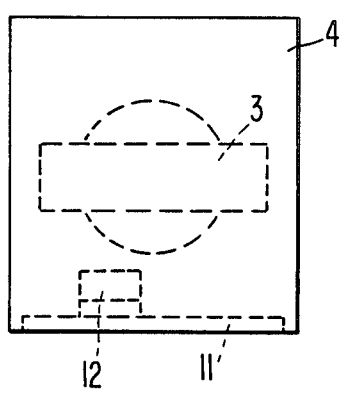
Figure 15B:
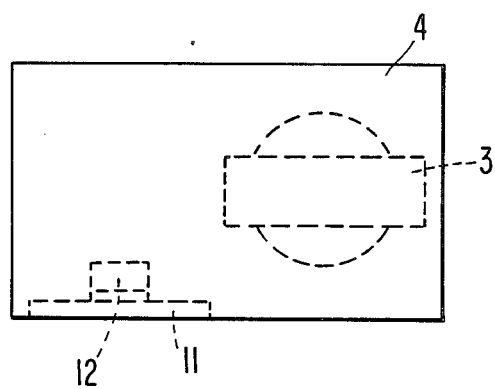
Figure 16A:
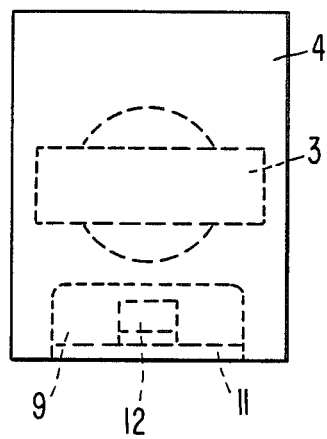
Figure 16B:
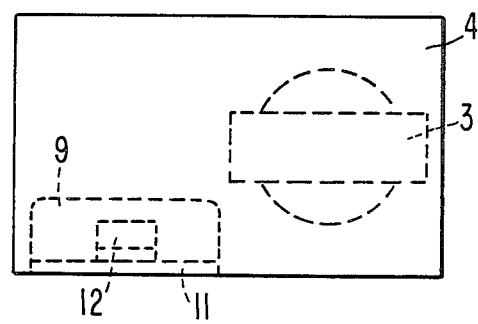
Figure 17A:
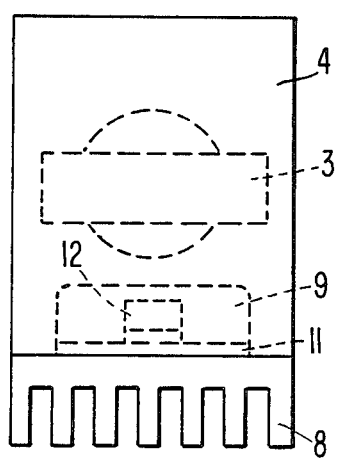
Figure 17B:
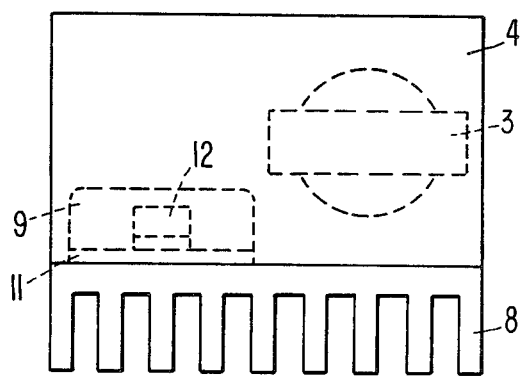

The embodiments of FIGS. 14(A) and 14(B) correspond to those of FIGS. 1 and 4, respectively. The embodiments of FIGS. 15(A) and 15(B) correspond to those of FIGS. 2 and 5, respectively. The embodiments of FIGS. 16(A), 16(B), 17(A) and 17(B) correspond to those of FIGS. 3 and 6, respectively. And the embodiments of FIGS. 18(A) and 18(B) correspond to those of FIG. 7.

In all of the above embodiments, the invention is applied to a flyback switching power supply. A power module of the same construction as the above embodiments can be realized with a switching power supply of another type.

Only the power circuit parts are mounted on circuit boards (1) and (2) in the above embodiments of the invention. Circuit boards (1) and (2) may contain control circuits and auxiliary power circuits in addition to the power circuits of the above embodiments. Alternatively, the snubber circuit may be eliminated from the power circuits mounted on the circuit boards.

In producing the power module of the present invention, circuit boards (1) and (2) and the converter transformer (3), appropriately arranged, may be three-dimensionally joined by the resin (4) as a unit or, alternatively, circuit boards (1) and (2) and the converter transformer (3) may be independently molded in resin (4) before they are joined.

What is claimed is:

1. A power module comprising:
a primary circuit board one major surface of which is an element mounting surface on which circuit elements of a primary circuit of a power circuit are mounted, the other major surface of said primary circuit board being a heat radiating surface on which no circuit element is mounted;
a secondary circuit board one major surface of which is an element mounting surface on which circuit elements of a secondary circuit of said power circuit are mounted, the other major surface of said secondary circuit board being a heat radiating surface on which no circuit element is mounted, said primary and secondary circuit boards being spaced apart from each other and disposed so that the respective element mounting surfaces face each other;
a converter transformer disposed in parallel with and adjacent to said primary and secondary circuit boards; and
a resin body of electrically insulating and thermally conductive resin embedding therein said primary and secondary circuit boards and said converter transformer so that said primary and secondary circuit boards and said converter transformer are three-dimensionally joined only with said resin body, said heat radiating surfaces of said primary and secondary circuit boards being exposed outside to form parts of opposite outer walls of said power module, wherein a clearance is provided within said resin body along each of said element mounting surfaces of said primary and secondary circuit boards, said clearance being filled with an electrically insulating and thermally low conductive material for preventing heat generated on each of said primary and secondary circuit boards from being transmitted through said resin body to said converter transformer.

2. A power module as claimed in claim 1, further comprising heat sinks provided on said opposite outer walls of said power module for enhancing heat radiation.

3. A power module as claimed in claim 2, wherein an additional clearance is provided within said resin body along a part of each of said heat sinks closer to said converter transformer for preventing heat generated on each of said primary and secondary circuit boards and transmitted to said part of each of said heat sinks from being further transmitted through said resin body to said converter transformer.

4. A power module comprising:
a primary circuit board having a first major surface which is an element mounting surface on which circuit elements of a primary circuit of a power circuit are mounted, said primary circuit board having a second major surface which is a heat radiating surface on which no circuit element is mounted;
a secondary circuit board having a first major surface which is an element mounting surface on which circuit elements of a secondary circuit of said power circuit are mounted, said secondary circuit board having a second major surface which is a heat radiating surface on which no circuit element is mounted, said primary and secondary circuit boards being spaced apart from each other with said first major surface of said primary circuit board facing said first major surface of said secondary circuit board;
a converter transformer disposed between a plane containing said first major surface of said primary circuit board and a plane containing said first major surface of said secondary circuit board;
means joining said primary circuit board, said secondary circuit board and said converter transformer together, said means comprising a resin body of electrically insulating and thermally conductive resin embedding therein said primary and secondary circuit boards with said second major surfaces uncovered by said resin body and said resin body embedding therein said converter transformer so that said primary and secondary circuit boards and said converter transformer are three-dimensionally joined solely by means of said resin body, said heat radiating second major surfaces of said primary and secondary circuit boards being exposed to form parts of opposite outer walls of said power module.

5. The power module of claim 4, wherein a clearance is provided within said resin body along each of said element mounting first major surfaces of said primary and secondary circuit boards, each said clearance being filled with an electrically insulating and thermally low conductive material for preventing heat generated on each of said primary and secondary circuit boards from being transmitted through said resin body to said converter transformer.

6. The power module of claim 4, further comprising heat sinks provided on said opposite outer walls of said power module for enhancing heat radiation.

7. The power module of claim 6, wherein said resin body fills a space between said first major surfaces of said primary and secondary circuit boards and said converter transformer is disposed outside said space with one end of said converter transformer adjacent said space, said resin body including an additional clearance along a part of each of said heat sinks facing said converte transformer for preventing heat generated on each of said primary and secondary circuit boards and transmitted to said part of each of said heat sinks from being further transmitted through said resin body to said converter transformer.

8. The power module of claim 4, wherein said converter transformer is disposed between said first major surfaces of said primary and secondary circuit boards.

* * * * *